United States Patent
Eun

(10) Patent No.: US 10,785,875 B2
(45) Date of Patent: Sep. 22, 2020

(54) FLEXIBLE PRINTED CIRCUIT BOARD AND DISPLAY MODULE USING THE SAME

(71) Applicant: LG Display Co., Ltd., Seoul (KR)

(72) Inventor: Juhee Eun, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/215,354

(22) Filed: Dec. 10, 2018

(65) Prior Publication Data
US 2019/0208642 A1 Jul. 4, 2019

(30) Foreign Application Priority Data

Dec. 28, 2017 (KR) .................. 10-2017-0182635

(51) Int. Cl.
| | |
|---|---|
| *H05K 1/00* | (2006.01) |
| *H05K 1/18* | (2006.01) |
| *G06F 1/16* | (2006.01) |
| *H05K 1/02* | (2006.01) |

(52) U.S. Cl.
CPC ........... *H05K 1/189* (2013.01); *G06F 1/1637* (2013.01); *G06F 1/1652* (2013.01); *G06F 1/1658* (2013.01); *H05K 1/028* (2013.01)

(58) Field of Classification Search
USPC ........................................ 361/749
See application file for complete search history.

(56) References Cited

U.S. PATENT DOCUMENTS

| | | | |
|---|---|---|---|
| 2003/0027479 A1* | 2/2003 | Sawamori | H01J 9/42 445/63 |
| 2016/0270234 A1* | 9/2016 | Ahn | G06F 3/0412 |
| 2017/0171990 A1* | 6/2017 | Kim | H05K 1/113 |

* cited by examiner

*Primary Examiner* — Andargie M Aychillhum
(74) *Attorney, Agent, or Firm* — Fenwick & West LLP

(57) ABSTRACT

A flexible printed circuit board and a display module are capable of enhancing a fixing force of the flexible printed circuit board to a display panel or an inspection jig, and prevent the flexible printed circuit board from being separated or detached as well as being torn upon attachment and detachment. The flexible printed circuit board includes a display panel including a display area and a non-display area; a flexible film attached to the display area and to which a driving unit is mounted; and a flexible printed circuit board attached to the flexible film and having a connector for receiving external signals, wherein the flexible printed circuit board includes: at least one hole fixing the flexible printed circuit board to a rear surface of the display panel by bending the flexible film; and at least one indent fixed to an inspection jig.

17 Claims, 4 Drawing Sheets

FLEXIBLE PRINTED CIRCUIT BOARD AND DISPLAY MODULE USING THE SAME

CROSS-REFERENCE TO RELATED APPLICATION

This application claims the benefit of Republic of Korea Patent Application No. 10-2017-0182635 filed on Dec. 28, 2017, the entire contents of which is incorporated herein by reference in its entirety.

BACKGROUND

Technical Field

The present disclosure relates to a flexible printed circuit board, in particular, to a flexible printed circuit board for enhancing a fixing force of the flexible printed circuit board to a display panel or a inspection jig, and prevent the flexible printed circuit board from being torn upon detachment and separation thereof, and a display module having the flexible printed circuit board.

Discussion of the Related Art

A flexible printed circuit board (FPCB) enables miniaturization of parts and light weight of products, thereby meeting the trend of light, thin, short and small requirements and a high density requirement of electronic industry. Also, the flexible printed circuit board is expected to be in high demand for electronic devices in the future because it is possible to provide flexibility in product design through the flexibility of the material used to forming the flexible printed circuit board.

Recently, electronic equipments have been more miniaturized according to a rapid development of an integration technique of a semiconductor integrated circuit and a development of a surface mounting technique for directly mounting small chip components. According to this trend, the flexible printed circuit board can be easily mounted to complex and confined spaces. Also, the flexible printed circuit board has advantages such as high density and three-dimensional wiring, high durability against repeated bending, no wiring error, and good assemblability. Accordingly, the flexible printed circuit board can be widely used not only in various display devices such as liquid crystal display devices, organic light emitting display devices and quantum dot display devices but also in cameras, printers, medical equipments and so on. And, the thickness of the flexible printed circuit board has been reduced according to the trends of the miniaturization, light weight, and thinness of the display devices. Hereinafter, a flexible printed circuit board applied to a display module will be described. The display module means a state before sets included in a display device are assembled.

A display module including a flexible printed circuit board is inspected and evaluated before it is released. The inspection can be carried out by a single inspection of the flexible printed circuit board itself, or after the flexible printed circuit board is attached to a display panel. For the inspection, the flexible printed circuit board or the display panel to which the flexible printed circuit board is attached, is fixed to an inspection jig. The inspection jig includes connection pins to be connected to a connector of the flexible printed circuit board and a connection pad on which the connection pins are disposed. The connector is generally connected to the connection pins by an inspector. During the inspection, the flexible jig and the flexible printed circuit board fixed on the inspection jig are frequently moved. Also, after the inspection is completed, the connector is separated from the connection pins. If the flexible printed circuit board is not firmly fixed to the inspection jig during the connection, movement, and separation or detachment processes, the flexible printed circuit board is separated or detached from the inspection jig. And also the flexible printed circuit board is damaged or torn by the detachment and attachment of the flexible printed circuit board during the repeated inspection processes.

SUMMARY

In order to solve such problems, inventors of the present disclosure contrive a flexible printed circuit board capable of increasing a fixing force between the flexible printed circuit board and the inspection jig so that the flexible printed circuit board may be stably seated on the inspection jig.

A problem to be solved according to an embodiment of the present disclosure, it is to provide a flexible printed circuit board and a display module having the same, capable of preventing the flexible printed circuit board from being detached or separated from an inspection jig in a fixing state of the flexible printed circuit board and the inspection jig as well as being torn upon attachment and detachment of the flexible printed circuit board, by forming holes or indents in locations where the flexible printed circuit board is capable of easily separated or detached from the inspection jig.

Another problem to be solved according to an embodiment of the present disclosure, it is to provide a flexible printed circuit board and a display module having the same, capable of being easily mounted to sets of the display panel upon the attachment of the flexible printed circuit board and the display panel by forming holes or indents in the flexible printed circuit board, wherein the holes or indents are used to couple the flexible printed circuit board to a rear surface of the display panel.

The problems to be solved by the present disclosure are not limited to the above-mentioned problems, and other problems not mentioned can be clearly understood by those skilled in the art from the following description.

A display module according to an embodiment of the present disclosure comprises a display panel including a display area and a non-display area; a flexible film attached to the display area and to which a driving unit is mounted; and a flexible printed circuit board attached to the flexible film and having a connector for receiving external signals, wherein the flexible printed circuit board includes: at least one hole fixing the flexible printed circuit board to a rear surface of the display panel by bending the flexible film; and at least one indent fixed to an inspection jig. Accordingly, it is possible to the fixing force between the flexible printed circuit board and the display panel or the inspection jig, thereby preventing the flexible printed circuit board from being detached or separated, and being torn upon attachment and detachment of the flexible printed circuit board.

A flexible printed circuit board according to an embodiment of the present disclosure comprises a first portion including a first hole fixing the flexible printed circuit board to any one of a display panel and an inspection jig, a second portion including a connector for receiving electrical signals and indents, and a third portion connect the first portion to the second portion. Accordingly, it is possible to enhance the fixing force between the flexible printed circuit board and the display panel or the inspection jig and prevent the flexible printed circuit board from being torn.

The details of other embodiments are included in the detailed description and the drawings In the embodiments of the present disclosure, it is possible to fix the flexible printed circuit board to the display panel or the inspection jig because the flexible printed circuit board includes at least one hole.

In the embodiments of the present disclosure, it is possible to enhance of the fixing force between the flexible printed circuit board and the inspection jig because the flexible printed circuit board includes at least one indent. Accordingly, it is possible to prevent the flexible printed circuit board from being torn due to separation or detachment.

In the embodiments of the present disclosure, it is possible to enhance durability of periphery of the flexible printed circuit board because the flexible printed circuit board includes support films. Accordingly, it is possible to prevent the flexible printed circuit board from being separated or detached from the inspection jig as well as being torn upon the attachment and detachment of the flexible printed circuit board.

In the embodiments of the present disclosure, it is possible to prevent the flexible printed circuit board from being bended or folded when protrusions of the inspection jig or the display panel are inserted into or removed from holes of the flexible printed circuit board because the flexible printed circuit board has the holes positioned at corners and chamfers formed at the corners where the holes are positioned.

In the embodiments of the present disclosure, it is possible to enhance the fixing force between the flexible printed circuit board and the inspection jig because the flexible printed circuit board has a connector for receiving external signals and an indent formed on one edge of the flexible printed circuit board.

In the embodiments of the present disclosure, it is possible to enhance the fixing force between the flexible printed circuit board and the inspection jig because the flexible printed circuit board has a connector for receiving external signals and at least one corner indent formed at a portion in which two edges of the flexible printed circuit board meet to each other.

In the embodiments of the present disclosure, it is possible to enlarge the area of the flexible printed circuit board because the flexible printed circuit board has an auxiliary hole exposing a driving unit. Accordingly, it is possible to secure spaces for resistors, chips, and wirings.

The scope of the claims is not limited by what is described in the description of the disclosure as the contents described to the problems to be solved, the means for resolving the problems, and the effects specified above do not specify essential features of the claims.

BRIEF DESCRIPTION

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
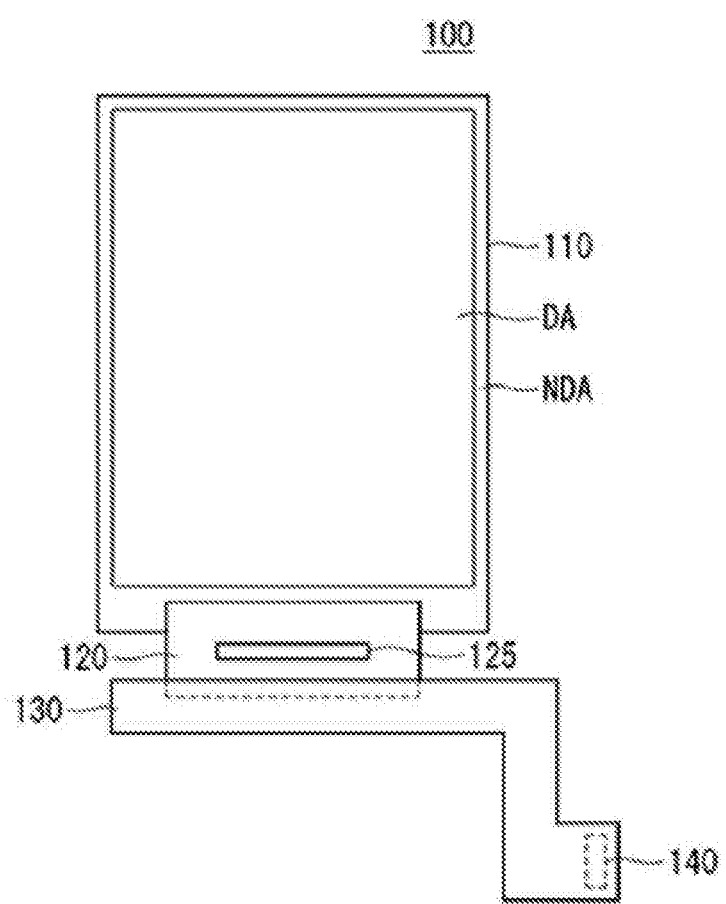
FIG. 1 is a plan view illustrating a front surface of display module according to an embodiment of the disclosure.

The advantages and features of the present disclosure, and how to accomplish them, will become apparent with reference to the embodiments described in detail below together with the accompanying drawings. However, the present disclosure is not limited to embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout. In the following description, when a detailed description of well-known functions or configurations related to this document is determined to unnecessarily cloud a gist of the disclosure, the detailed description thereof will be omitted. In the present disclosure, when the terms "include", "have", "comprised of", etc. are used, other components may be added unless "~only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

In the description of a temporal relationship, for example, if a temporal anterior or posterior relationship is described by 'after', 'following to', 'and then', 'before', etc., it can includes cases is not continuous when terms such as 'right' or 'direct' are not used together.

The terms "first", "second", etc. may be used to describe various components, but the components are not limited by such terms. The terms are used only for the purpose of distinguishing one component from other components. For example, a first component may be designated as a second component without departing from the scope of the present disclosure.

The features of various embodiments of the present disclosure can be partially combined or entirely combined with each other, and can be technically interlocking-driven in various ways. The embodiments can be independently implemented, or can be implemented in conjunction with each other.

Hereinafter, a display module according to an embodiment of the present disclosure will be described with reference to the accompanying drawings FIG. 1 is a plan view illustrating a display module according to an embodiment of the disclosure.

The display module 100 of FIG. 1 includes a display panel 110, a flexible film 120, and a flexible printed circuit board 130.

The display panel 110 may include various display panels such as liquid crystal display panels, electroluminescent display panels, quantum dot display panels, electrophoretic display panels, and electro-wetting display panels. The display panel 110 may includes a display area DA on which an image is displayed and a non-display area NDA on which the image is not displayed. The non-display area NDA may also be referred to as a bezel area which is an outer frame portion of the display area DA. The bezel area may be disposed at sides constituting the display panel according to a required design of the display panel so that an area positioned at one of four sides is wider than an area positioned at other sides of four sides, or has no area.

In the display area DA of the display panel 110, a plurality of pixels are disposed to display an image. The plurality of pixels may display the image by receiving electric signals such as video signals and drive signals, and power sources from the outside. To this end, the flexible printed circuit board 130 is connected to the display panel 110 to supply the electric signals and the power sources to the display panel 110. The flexible printed circuit board 130 includes a connector 140 to receive the electrical signals and the power sources from the outside. The flexible printed circuit board 130 may include wires, resistors, and chips to supply the electric signals and the power sources received from the connector 140 to the display panel 110. The thickness of the flexible printed circuit board 130 is approximately several hundreds of micrometers, but it is gradually decreasing. For example, the thickness of the flexible printed circuit board 130 may be 200 μm or less, but is not limited thereto. As the thickness of the flexible printed circuit board 130 becomes thin, the flexibility of the flexible printed circuit board 130 increases, and the display module 100 can be lightweight and thin. However, as the flexibility of the flexible printed circuit board 130 increases, the flexible printed circuit board 130 may be more easily bent, curled, and lifted. For example, a phenomenon that the flexible printed circuit board 130 is lifted at edge portions or corner portions of the flexible printed circuit board 130, is frequently occurred. The explanation thereof will be described later in detail.

In order to display an image using the plurality of pixels, it is necessary to process external signals. To this end, the external signals input through the connector 140 are supplied to the display panel 110 via a driving unit 125. The driving unit 125 outputs gate timing control signals for controlling an operation timing of a gate driver, data timing control signals for controlling an operation timing of a data driver, and data signals having luminance information of the image to be displayed on the display panel 110. The driving unit 125 samples and latches the data signals and converts them into analog data signals based on the gamma reference voltage. The driving unit 125 outputs the data signals through the data lines.

The driving unit 125 may be mounted on the display panel 110. In this disclosure, the driving unit 125 is mounted on the flexible film 120 as an example. In this case, the flexible film 120 connects the display panel 110 and the flexible printed circuit board 130 between the display panel 110 and the flexible printed circuit board 130. The flexible film 120 may be a film type substrate in which a circuitry is formed by forming a copper foil on a film made of a polymer material. The driving unit 125 may be mounted on the flexible film 120 in a thermo compression bonding manner, but is not limited thereto.

Each of the non-display area NDA of the display panel 110 and the flexible printed circuit board 130 include pads to be attached to the flexible film 120. The flexible film 120 may be attached to a pad region on which the pads are disposed using an anisotropic conductive film and so on. Similarly, the flexible printed circuit board 130 may be attached to the flexible film 120 using the anisotropic conductive film and so on. In this case, the anisotropic conductive film is formed by mixing an adhesive that is cured by heat and conductive particles in the adhesive. The flexible film 120 and the display panel 110 as well as the flexible film 120 and the flexible printed circuit board 130 can be electrically connected to each other via the conductive particles. Therefore, the external signals input through the connector 140 are supplied to the display panel 110 via the driving unit 125.

FIG. 1 is a plan view illustrating a front surface of display module according to an embodiment of the disclosure. The flexible film 120 may be attached to a front surface of the display panel 110 and a rear surface of the flexible printed circuit film 130. The connector 140 may be disposed on the rear surface of the flexible printed circuit film 130, but is not limited thereto.

Figure 2:
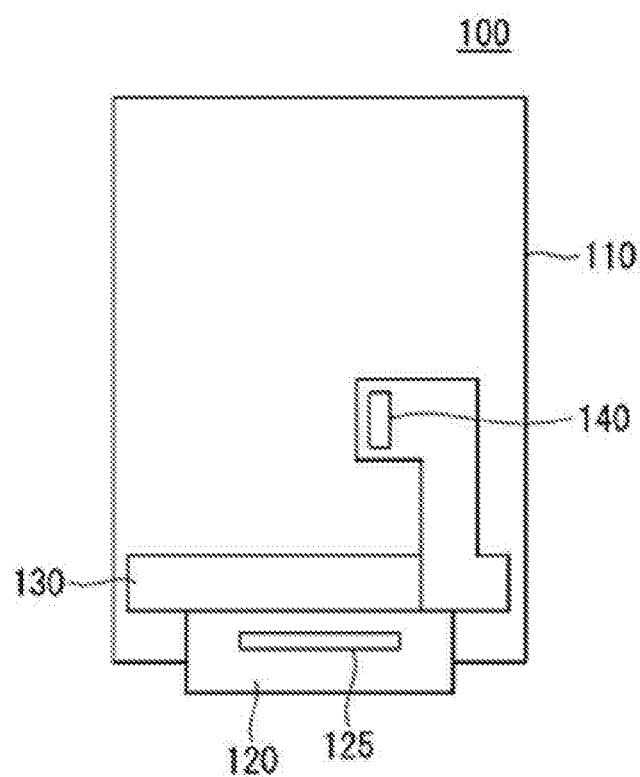
FIG. 2 is a plan view illustrating a rear surface of a display module according to an embodiment of the disclosure.

FIG. 2 is a plan view illustrating a rear surface of the display module according to an embodiment of the disclosure.

FIG. 2 is a plan view illustrating the rear view of the display module 100 shown in FIG. 1, in which the flexible printed circuit board 130 is arranged on the rear of the display panel 110 before sets of the display module are assembled. In order to pack the flexible printed circuit board 130 into sets, the flexible printed circuit board 130 must overlap the display panel 110. In this case, a portion of the flexible film 120 is bent so that the flexible printed circuit board 130 is positioned on the rear surface of the display panel 110. In order to fix the flexible printed circuit board 130 to the rear surface of the display panel 110, the flexible printed circuit board 130 needs a structure for fixing it to the rear surface of the display panel 110.

Also, a portion of the flexible printed circuit board 130 may be folded so that the connector 140 of the flexible printed circuit board 130 may be completely located in the rear surface of the display panel 110. The connector 140 may be connected to connection pads included in the sets assembled to the rear surface of the display panel 110. In this case, it is necessary for the connector 140 to be accurately positioned on the rear surface of the display panel 110 so that the connector 140 may be assembled to the sets.

Figure 3:
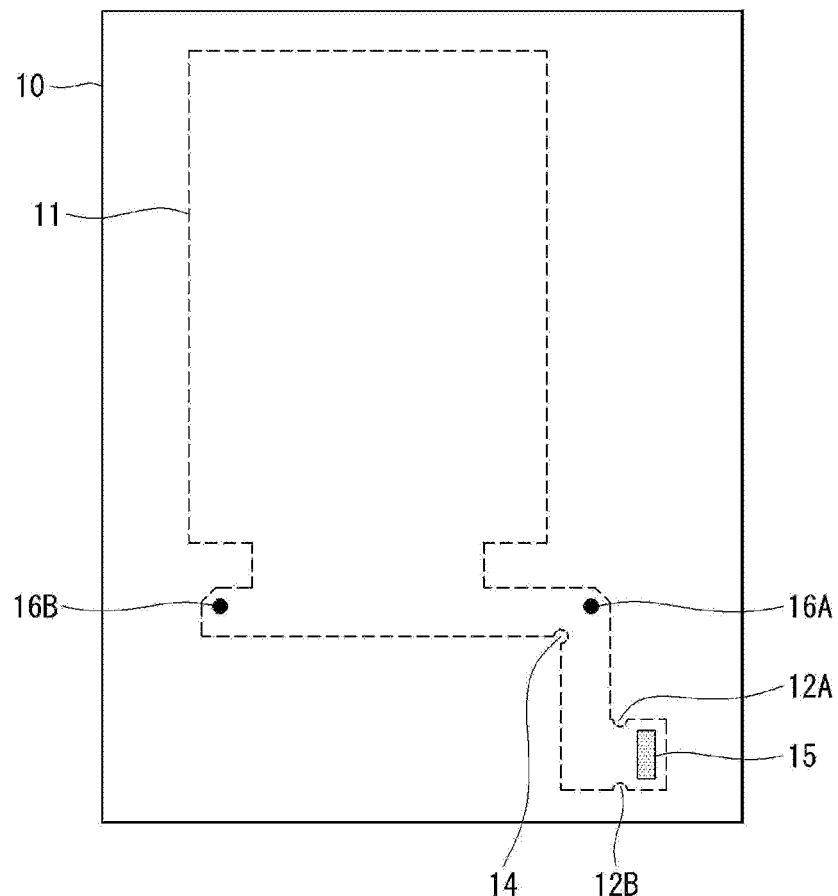
FIG. 3 is a plan view illustrating an inspection jig according to an embodiment of the disclosure.

FIG. 3 is a plan view illustrating an inspection jig according to an embodiment of the present disclosure.

In inspecting defects of the flexible printed circuit board 130, only the flexible printed circuit board 130 may be inspected. Otherwise, the flexible printed circuit board 130 may be inspected in a state in which the flexible printed circuit board 130 is attached to the display panel 110. In order to proceed with the inspection, the display module 100 is placed on the inspection jig 10. In this case, in order to accurately place the display module 100 at a predetermined position, the inspection jig 10 includes grooves formed along the module placing portion 11 having a shape corresponding to the display module 100. In FIG. 3, the inspection of the display module 100 will be described as an example. However, the present disclosure is not limited thereto, and the shape of the grooves included in the inspection jig may be various depending on a type of inspection jigs for each process step. Hereinafter, the display module 100 will be described by way of an example referring a case in which a flexible printed circuit board according to a first embodiment of the present disclosure to be described later is attached, but the present disclosure is not limited thereto. For example, the display module 100 may be applied to flexible printed circuit boards according to second and third embodiments.

The inspection jig 10 includes a connection pad 15 to be connected to the connector 140 of the flexible printed circuit board 130 to supply external signals to the display module 100 through the inspection jig 10. An inspector may apply pressure to a rear surface of the connector 140 to connect the connector 140 of the flexible printed circuit board 130 placed on the inspection jig 10 to the connection pad 15. The inspection jig 10 on which the display module 100 is placed may be moved for an inspection progress. Otherwise, the inspector may perform additional checking operations such as moving the flexible printed circuit board 130 to inspect whether the display module 100 is correctly placed on the inspection jig 10. In this case, the display module 100 has to be placed on a correct position of the inspection jig 10 so that the connector 140 and the connection pad 15 are correctly connected, the display module 100 is not separated or detached from the inspection jig 10, and the flexible printed circuit board 130 is not torn upon the attachment and detachment thereof. Therefore, the inspection jig 10 may include a first holding portion 12A, a second holding portion 12B, a third holding portion 14, a first protrusion 16A, and a second projection 16B. The first holding portion 12A, the second holding portion 12B, and the third holding portion 14 are formed in a concave shape so as to enter into the flexible printed circuit board 130. The first protrusion portion 16A and the second protrusion portion 16B protrude upward from a plane of the inspection jig 10 in grooves formed according to the shape of the module placing portion 11 of the inspection jig 10. For example, the first protrusion 16A and the second protrusion 16B may have a cylindrical shape, but are not limited thereto. The connector 140 of the flexible printed circuit board 130 is placed on a correct position of the inspection jig 10, and the third holding portion 14 is placed at a bending portion of the flexible printed circuit board 130. Thus, the first holding portion 12A and the second holding portion 12B prevent the flexible printed circuit board 130 from being shaken and lifted off, and the first protrusion portion 16A and the second protrusion portion 16B fix the flexible printed circuit board 130 to the inspection jig 10. As a result, the first holding portion 12A, the second holding portion 12B, the third holding portion 14, the first protrusion 16A and the second protrusion 16B can accurately place the display module 100 on the module placing portion 11 of the inspection jig 10.

In the course of the inspection, according to a type of the inspection device, it is possible that the display module 100 is placed on the inspection jig 10, and then the display module 100 is covered with another jig. If the display module 100 is not correctly placed on the module placing portion 11 of the inspection jig 10, the flexible printed circuit board 130 may be scratched and torn, or other parts may be pressed down by a pressing of the another jig covering the display module 100. The display module 100 can be accurately placed on the module placing portion 11 of the inspection jig 10 because the inspection jig 10 includes the module placing portion 11 having the first holding portion 12A, the second holding portion 12B, the third holding portion 14, the first protrusion portion 16A and the second protrusion portion 16B. Therefore, it is possible to improve the fixing force of the flexible printed circuit board 130 during an inspection process and to prevent the flexible printed circuit board 130 from being separated or detached, and being torn upon attachment and detachment of the flexible printed circuit board 130.

The first holding portion 12A, the second holding portion 12B, the third holding portion 14, the first protrusion portion 16A, and the second protrusion portion 16B formed on the inspection jig 10 may be changed depending on shapes of flexible printed circuit boards according to a second embodiment and a third embodiment of the present disclosure which will be described later.

Figure 4:
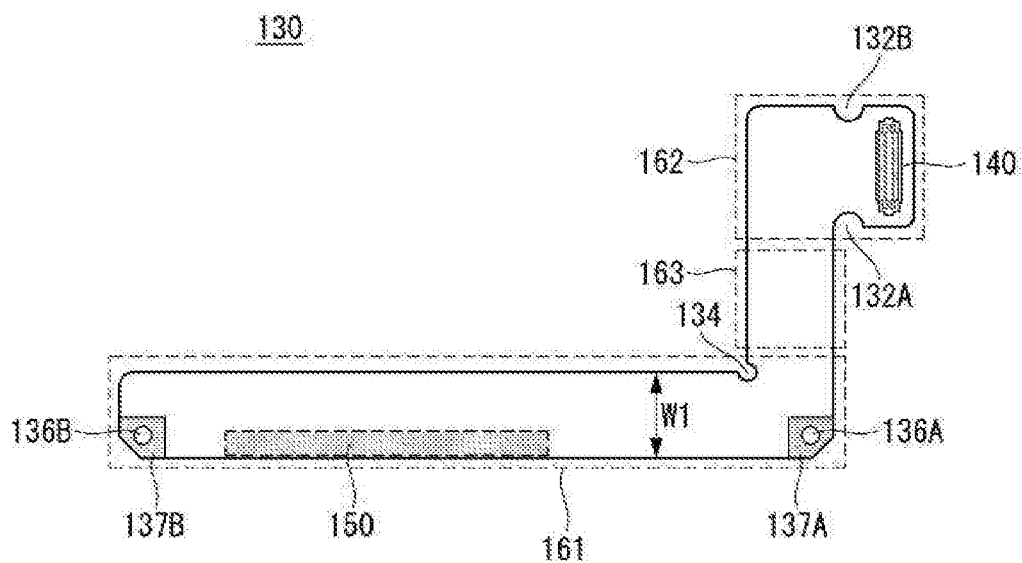
FIG. 4 is a plan view illustrating a flexible printed circuit board according to a first embodiment of the disclosure.

FIG. 4 is a plan view illustrating a flexible printed circuit board according to a first embodiment of the disclosure.

The flexible printed circuit board 130 according to the first embodiment of the disclosure may include a first portion 161, a second portion 162 and a third portion 163. The first portion 161 is attached to the flexible film 120, the second portion 162 includes a connector 140 for receiving external signals, and the third portion 163 connects the first portion 161 to the second portion 162. Herein, the shape formed by the second portion 162 and the third portion 163 is 'L-' shape, but is not limited thereto.

The first portion 161 includes an attachment portion 150 to be attached to the flexible film 120. The attachment portion 150 is a region in which anisotropic conductive film is disposed to attach the flexible film 120 to the flexible printed circuit board 130. The attachment portion 150 may have a width which is at least 10% to less than 30% of the width W1 of the flexible printed circuit board 130. Since an adhesive strength between the flexible film 120 and the flexible printed circuit board 130 is low if the attachment portion 150 is less than 10% of the width W1 of the flexible printed circuit board 130, the flexible printed circuit board 130 may be detached from the flexible film 120 or the flexible printed circuit board 130 around the attachment portion 150 may be torn. If the mounting portion 150 is 30% or more of the width W1 of the flexible printed circuit board 130, the space for forming the necessary resistors, chips, and wirings in the flexible printed circuit board 130 may be insufficient. The flexible film 120 can be sufficiently fixed to the flexible printed circuit board 130 because the attachment portion 150 to which the flexible printed circuit board 130 and the flexible film 120 are attached by the anisotropic conductive film is formed to be 10% or more and less than 30% of the width W1 of the flexible printed circuit board 130.

The first portion 161 of the flexible printed circuit board 130 includes at least one hole to fix the bended flexible printed circuit board 130 to the rear surface of the display panel 110 or fix the display module 100 to the module placing portion 11 of the inspection jig 10. In this case, the first portion 161 includes a first hole 136A and a second hole 136B. The first hole 136A and the second hole 136B may be disposed at any two of the corners included in the first portion 161. In this case, the first hole 136A and the second hole 136B are disposed on both corners of the attachment portion 150, but are not limited thereto. If each diameter of the first hole 136A and the second hole 136B is too large, the flexible printed circuit board 130 may be torn, or the space for accommodating resistors, chips and wirings to be disposed in the flexible printed circuit board 130 may be insufficient. Each diameter of the first hole 136A and the second hole 136B may be less than 10% of the width W1 of the flexible printed circuit board 130. For example, if the width W1 of the flexible printed circuit board 130 is 10 mm, the diameter of the first hole 136A and the diameter of the second hole 136B may be 0.5 mm.

While inspecting the flexible printed circuit board 130, the first protrusion 16A and the second protrusion 16B of the inspection jig 10 may be repeatedly inserted into or removed from the first hole 136A and the second hole 136B in the first portion 161. In this case, the flexible printed circuit board 130 around the first hole 136A and the second hole 136B may be torn or weakened due to friction therebetween. Accordingly, the flexible printed circuit board 130 may include a first support film 137 surrounding a first hole 136A and the second support film 137B surrounding the second hole 136B. The first support film 137A and the second support film 137B may be formed of a polyimide-based material, but it is not limited thereto. The first support film 137A and the second support film 137B strengthen the periphery of the first hole 136A and the second hole 136B to prevent the periphery of the first hole 136A and the second hole 136B from being torn. In addition, it is possible to reduce that the phenomenon that the flexible printed circuit board 130 is lifted from the rear surface of the display panel 110 or the inspection jig 10 by increasing the thickness of the edge of the flexible printed circuit board 130. Also, the flexible printed circuit board 130 may further include chamfers cut at corners where the first hole 136A and the second hole 136B are disposed. The chamfers may be formed such that a part of the corner is removed. The angle of the corner after cutting the corner may be formed larger than the right angle. In addition, the other corners of the flexible printed circuit board 130 may not be at right angles. For example, the other corners may be formed in a round shape with curvature. The flexible printed circuit board 130 includes the chamfers or the corners of the round shape, thereby preventing the corners and edges of the flexible printed circuit board 130 from being curled.

The second portion 162 of the flexible printed circuit board 130 includes a connector 140 for receiving external signals. Because the corners and edges of the flexible printed circuit board 130 is warped or curled as the thickness of the flexible printed circuit board 130 becomes thin, even if the connector 140 is fastened to the rear surface of the display panel 110 or the inspection jig 10, the connector 140 is separated or detached from the display panel 110 or the inspection jig 10. If the flexible printed circuit board 130 is not placed at the correct position, it is impossible to connect the flexible printed circuit board 130 due to inconsistency of the position of the connector 140. Otherwise, the connector 140 may be detached or separated because the flexible printed circuit board 130 is pulled out when the flexible printed circuit board 130 is connected. In the present disclosure, because the second portion 162 surrounds the connector 140 for a stable connection of connector 140, and includes a first indent 132A and a second indent 132A at edges of a straight line of the flexible printed circuit board 130, the fixing force of the second portion 162 of the flexible printed circuit board 130 as well as the connection force of the connector 140 can be improved.

The flexible printed circuit board 130 may include a corner indent 134 formed at a bended portion of the flexible printed circuit board 130, that is, at a position where one edge line of the third portion 163 meets one edge line of the first portion 161. The bending portion of the flexible printed circuit board 130 according to the first embodiment of the present disclosure may be a position where the first portion 161 and the second portion 162 are adjacent to each other. The corner indent 134 improves the fixing force between the flexible printed circuit board 130 and the rear surface of the display panel 100 or the inspection jig 10.

The third portion 163 of the flexible printed circuit board 130 connects the first portion 161 to the second portion 162. The third portion 163 can be formed in various forms for connecting the connector 140 of the second portion 162 to the set to be mounted on the rear surface of the display module 100.

Referring to FIGS. 3 and 4, when the flexible printed circuit board 130 is placed on the inspection jig 10, the first holding portion 12A, the second holding portion 12B and the third holding portion 14 of the inspection jig 10 are drawn into the first indent 132A, the second indent 132B and the corner indent 134 of the flexible printed circuit board 130, respectively. And the first protrusion 16A and the second protrusion 16B of the inspection jig 10 are inserted into the first hole 136A and the second hole 136B of the flexible printed circuit board 130, respectively. As a result, the flexible printed circuit board 130 can be accurately placed on the module placing portion 11 of the inspection jig 10. Therefore, it is possible to prevent the flexible printed circuit board 130 form being detached or separated according to improvement of the fixing force. Also, it is possible to prevent the flexible printed circuit board 130 form being torn during the attachment and detachment thereof.

Figure 5:
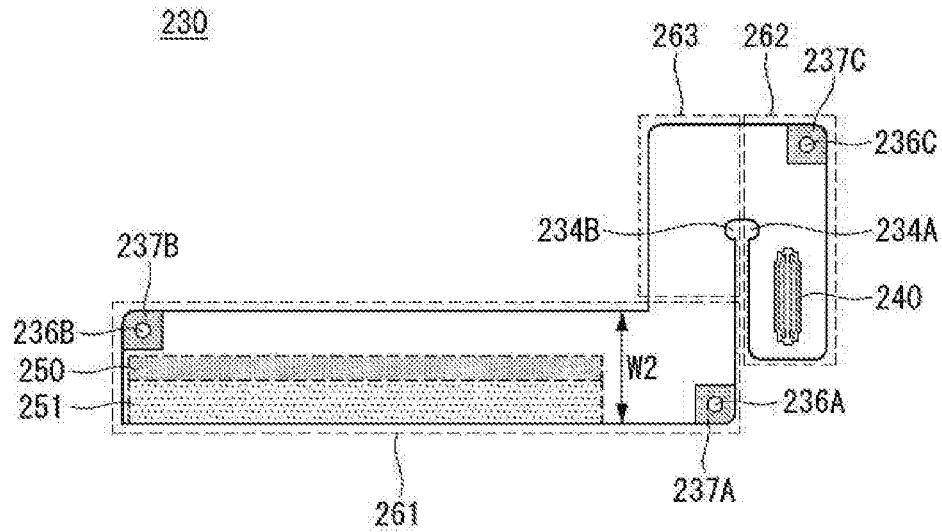
FIG. 5 is a plan view illustrating a flexible printed circuit board according to a second embodiment of the disclosure.

FIG. 5 is a plan view illustrating a flexible printed circuit board according to a second embodiment of the disclosure. The same components as those included in the flexible printed circuit board according to the first embodiment of the present disclosure among the components included in the flexible printed circuit board according to the second embodiment of the present disclosure may have the same effect. Therefore, the description for the components which are common to the first and second embodiments may be simplified or omitted.

The flexible printed circuit board 230 according to the second embodiment of the present disclosure may include a first portion 261, a second portion 262, and a third portion 263. The first portion 261 is attached to the flexible film 120, the second portion 262 includes a connector 240 for receiving external signals, and the third portion 263 connects the first portion 261 to the second portion 262. Herein, the shape formed by the second portion 262 and the third portion 263 is 'ㄱ' shape, but is not limited thereto.

The first portion 261 of the flexible printed circuit board 230 includes an attachment portion 250 to be attached to the flexible film 120. The attachment portion 250 is a region in which anisotropic conductive film is disposed to attach the flexible film 120 to the flexible printed circuit board 230. The width W2 of the flexible printed circuit board 230 according to the second embodiment of the present disclosure is longer than the width W1 of the flexible printed circuit board 130 according to the first embodiment of the present disclosure to secure a space for resistors, chips, and wirings. The flexible printed circuit board 230 and the flexible film 120 are overlapped with each other at an overlapping portion 251 because the attachment portion 250 is formed at an inner side of the flexible printed circuit board 230. The width W2 of the flexible printed circuit board 230 according to the second embodiment is longer than the width W1 of the flexible printed circuit board 130 according to the first embodiment by the overlapping portion 251. In this case, the first portion 261 of the flexible printed circuit board 230 may be extended as long as it does not overlap the driving unit 125 on the flexible film 120. Therefore, the flexible printed circuit board 230 according to the second embodiment can secure the space for resistors, chips, and wirings.

Also, the first portion 261 of the flexible printed circuit board 230 includes at least one hole to fix the bended flexible printed circuit board 230 to the rear surface of the display panel 110 or fix the display module 100 to the module placing portion 11 of the inspection jig 10. In this case, the first portion 261 includes a first hole 236A and a second hole 236B. The first hole 236A and the second hole 236B may be disposed symmetrically with respect to opposite corners of corners included in the first portion 261. Each diameter of the first hole 236A and the second hole 236B may be less than 10% of the width W1 of the flexible printed circuit board 230.

While inspecting the flexible printed circuit board 230, the first protrusion 16A and the second protrusion 16B of the inspection jig 10 may be repeatedly inserted into or removed from the first hole 236A and the second hole 236B in the first portion 261. In this case, the flexible printed circuit board 230 around the first hole 236A and the second hole 236B may be torn or weakened due to friction therebetween. Accordingly, the flexible printed circuit board 230 may include a first support film 237 surrounding a first hole 236A and the second support film 237B surrounding the second hole 236B. The first support film 237A and the second support film 237B may be formed of a polyimide-based material, but it is not limited thereto. The first support film 237A and the second support film 237B strengthen the periphery of the first hole 236A and the second hole 236B to prevent the periphery of the first hole 236A and the second hole 236B from being torn. In addition, it is possible to reduce that the phenomenon that the flexible printed circuit board 230 is lifted from the rear surface of the display panel 110 or the inspection jig 10 by increasing the thickness of the edge of the flexible printed circuit board 230. Also, the corners are chamfered at positions where the first and second holes 236A and 236B are disposed, but the present disclosure is not limited thereto. For example, the corners of the flexible printed circuit board 230 may not be at right angles. It is possible to prevent the corners and edges of the flexible printed circuit board 230 from being curled because the flexible printed circuit board 230 includes the chamfers or the corners of the round shape.

The second portion 262 of the flexible printed circuit board 230 includes a connector 240 for receiving external signals. Because the corners and edges of the flexible printed circuit board 230 may be warped or curled as the thickness of the flexible printed circuit board 130 becomes thin, even if the connector 240 is fixed to the rear surface of the display panel 110 or the inspection jig 10, the connector 240 may be separated or detached from the display panel 110 or the inspection jig 10. If the flexible printed circuit board 230 is not placed at the correct position, it is impossible to fix the flexible printed circuit board 230 due to inconsistency of the position of the connector 240. Otherwise, the connector 240 may be detached or separated because the flexible printed circuit board 230 is pulled out when the flexible printed circuit board 230 is connected. Thus, there is a need for a method that allows the connector 240 to be placed at the correct position.

The third portion 263 of the flexible printed circuit board 230 connects the first portion 261 to the second portion 262. The second portion 262 and the third portion 263 form a 'ㄷ' shape. In order to fix the second portion 262 and the third portion 263 to the inspection jig 10 and to securely connect the connector 240, the second portion 262 and the third portion 263 may first and second edge indents 234A and 234B adjacent to the connector 240 and formed at a position where the second portion 262 and the third portion 263 are in contact with each other. In this case, it is possible to omit corner indent at the bending portion of the flexible printed circuit board 230 because the first edge indent 234A and the second edge indent 234B are adjacent to the bending portion of the flexible printed circuit board 230 according to the 'ㄷ' shape formed by the second portion 262 and the third portion 263. However, the present disclosure is not limited thereto. For example, it is possible to form an additional corner indent at the bending portion of the flexible printed circuit board 230 to improve the fixing force of the flexible printed circuit board 230. The bending portion of the flexible printed circuit board 230 according to the second embodiment of the present disclosure may be a portion where the first portion 261 and the second portion 262 are adjacent to each other or a portion where the second portion 262 and the third portion 263 are adjacent to each other.

The flexible printed circuit board 230 may include a third hole 236C formed at a corner of the first portion 262, but is not limited thereto. The third hole 236C may be formed at a corner of the third portion 263.

Figure 6:
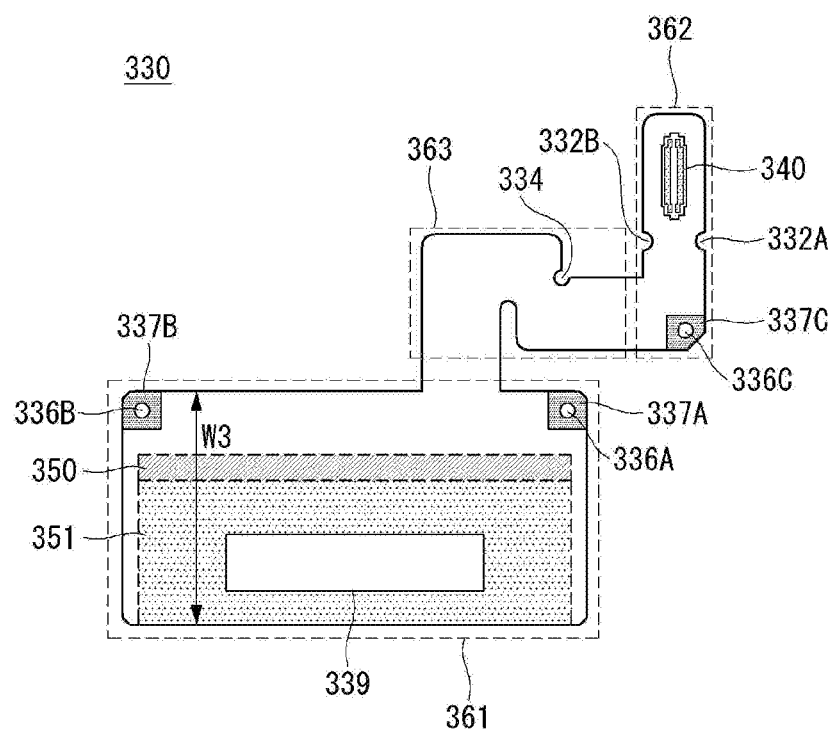
FIG. 6 is a plan view illustrating a flexible printed circuit board according to a third embodiment of the disclosure.

FIG. 6 is a plan view illustrating a flexible printed circuit board according to a third embodiment of the disclosure. The same components as those included in the flexible printed circuit board according to the first embodiment of the present disclosure among the components included in the flexible printed circuit board according to the third embodiment of the present disclosure may have the same effect. Therefore, the description for the components which are common to the first and third embodiments may be simplified or omitted.

The flexible printed circuit board 330 according to the third embodiment of the present disclosure may include a first portion 361, a second portion 362, and a third portion 363. The first portion 361 is attached to the flexible film 120, the second portion 362 includes a connector 340 for receiving external signals, and the third portion 363 connects the first portion 361 to the second portion 362. Herein, the shape formed by the second portion 362 and the third portion 363 is 'ㄷ', but is not limited thereto.

The first portion 361 of the flexible printed circuit board 330 includes an attachment portion 350 to be attached to the flexible film 120. The attachment portion 350 is a region in which anisotropic conductive film is disposed to attach the flexible film 120 to the flexible printed circuit board 330. The width W3 of the flexible printed circuit board 330 according to the third embodiment of the present disclosure is longer than the width W1 of the flexible printed circuit board 130 according to the first embodiment of the present disclosure or the width W2 of the flexible printed circuit board 230 according to the second embodiment of the present disclosure to secure a space for resistors, chips, and wirings. The first portion 361 of the flexible printed circuit board 330 is extended to fully cover the driving unit 125 of the flexible film 120. In this case, due to the driving unit 125, the flexible printed circuit board 330 may be lifted and torn at a region where the flexible printed circuit board 330 and the driving unit 125 are overlapped. In the present disclosure, the flexible printed circuit board 230 further includes an auxiliary hole 339 in the region overlapping the driving unit 125. Accordingly, it is possible to prevent the flexible printed circuit board 330 from being lifted, torn, or being detached from the flexible film 120. Since the attachment portion 350 is formed at an inner side of the flexible printed circuit board 330, the flexible printed circuit board 330 and the flexible film 120 are overlapped at an overlapping portion 351. The width W3 of the flexible printed circuit board 330 according to the third embodiment is longer than the width W1 of the flexible printed circuit board 230 according to the second embodiment by the overlapping portion 351. Therefore, the flexible printed circuit board 330 according to the third embodiment can secure the space for resistors, chips, and wirings.

Also, the first portion 361 of the flexible printed circuit board 330 includes at least one hole to fix the bended flexible printed circuit board 330 to the rear surface of the display panel 110 or fix the display module 100 to the module placing portion 11 of the inspection jig 10. In this case, the first portion 361 includes a first hole 336A and a second hole 336B. The first hole 336A and the second hole 336B may be disposed at corners positioned at an upper side of the first portion 361. Each diameter of the first hole 336A and the second hole 336B may be less than 10% of the width W3 of the flexible printed circuit board 330.

While inspecting the flexible printed circuit board 3230, the first protrusion 16A and the second protrusion 16B of the inspection jig 10 may be repeatedly inserted into or removed from the first hole 336A and the second hole 336B in the first portion 361. In this case, the flexible printed circuit board 330 around the first hole 336A and the second hole 336B may be torn or weakened due to friction therebetween. Accordingly, the flexible printed circuit board 330 may include a first support film 337A surrounding a first hole 336A and the second support film 337B surrounding the second hole 336B. The first support film 337A and the second support film 337B may be formed of a polyimide-based material, but it is not limited thereto. The first support film 337A and the second support film 337B strengthen the periphery of the first hole 336A and the second hole 336B to prevent the periphery of the first hole 336A and the second hole 336B from being torn. In addition, it is possible to reduce that the phenomenon that the flexible printed circuit board 330 is lifted from the rear surface of the display panel 110 or the inspection jig 10 by increasing the thickness of the edge of the flexible printed circuit board 330. Also, the flexible printed circuit board 330 may further include chamfers cut at corners where the first hole 336A and the second hole 336B are disposed, but the present disclosure is not limited thereto. The chamfers of the flexible printed circuit board 330 may not be at right angles. For example, the corners may be formed in a round shape with curvature. The flexible printed circuit board 330 includes the chamfers or the corners of the round shape, thereby preventing the corners and edges of the flexible printed circuit board 330 from being curled.

The second portion 362 of the flexible printed circuit board 330 includes a connector 340 for receiving external signals. Because the corners and edges of the flexible printed circuit board 330 may be warped or curled as the thickness of the flexible printed circuit board 130 becomes thin, even if the connector 340 is fixed to the rear surface of the display panel 110 or the inspection jig 10, the connector 340 may be separated or detached from the display panel 110 or the inspection jig 10. If the flexible printed circuit board 330 is not placed on the correct position, it is impossible to fix the flexible printed circuit board 330 to the correct position due to inconsistency of the position of the connector 340. Otherwise, the connector 340 may be detached or separated because the flexible printed circuit board 330 is pulled out when the flexible printed circuit board 330 is fixed. In the present disclosure, the second portion 362 surrounds the connector 340 for a stable fastening of connector 340 and includes a first indent 332A and a second indent 332A at edges of a straight line of the flexible printed circuit board 330. Accordingly, the fixing force of the second portion 362 of the flexible printed circuit board 330 and the fastening force of the connector 340 can be improved.

The third portion 363 of the flexible printed circuit board 330 connects the first portion 361 to the second portion 362. The third portion 363 can be formed in various forms for fastening the connector 340 of the second portion 362 to the set to be mounted on the rear surface of the display module 100. Since the third portion 363 of the flexible printed circuit board 330 according to the third embodiment of the present disclosure includes a bending portion, the third portion 363 may include a corner indent 334. The bending portion of the flexible printed circuit board 330 according to the third embodiment of the present disclosure may be included in the third portion 363 and positioned at an area where the second portion 362 and the third portion 363 adjacent to each other. In the third embodiment, the bending portion may be omitted because it is adjacent to the first indent 332A and the second indent 332B, but this disclosure is not limited thereto. An additional corner indent may be formed to enhance the fixing force of the flexible printed circuit board 330.

The flexible printed circuit board 330 may include a third hole 336C formed at a corner of the second portion 362, but this disclosure is not limited thereto. The third hole 336C may be formed at a corner of the third portion 363.

As the second portions 262 and 362 and the third portions 263 and 363 have more complicated shapes as in the second embodiment or the third embodiment of the present disclosure, it is possible to prevent the corners or the edges of the printed circuit board from being lifted by forming further holes and indents.

A display module according to embodiments of the present disclosure may be described as follows.

A display module according to an aspect of the present disclosure comprises a display panel including a display area and a non-display area; a flexible film attached to the display area and to which a driving unit is mounted; and a flexible printed circuit board attached to the flexible film and having a connector for receiving external signals, wherein the flexible printed circuit board includes: at least one hole fixing the flexible printed circuit board to a rear surface of the display panel by bending the flexible film; and at least one indent fixed to an inspection jig. Thus, the display module according to the present disclosure can improve a fixing force with respect to the display panel or the inspection jig, thereby preventing the flexible printed circuit board from being separated or detached, and being torn upon attachment or detachment of the flexible printed circuit board.

According to another aspect of the present disclosure, the flexible printed circuit board may include a support film surrounding the hole.

According to another aspect of the present disclosure, the hole may be disposed at corner of the flexible printed circuit board, and the corner in which the hole is disposed may be chamfered.

According to another aspect of the present disclosure, a plurality of corners of the flexible printed circuit board may be not right angles.

According to another aspect of the present disclosure, the indent may be disposed on an edge constituting a shape of the flexible printed circuit board.

According to another aspect of the present disclosure, the indent may be disposed on an edge surrounding and adjacent to the connector.

According to another aspect of the present disclosure, the flexible printed circuit board may include a corner indent formed at a portion in which two edges of the flexible printed circuit board meet to each other.

According to another aspect of the present disclosure, the flexible printed circuit board further may include an auxiliary hole exposing the driving unit.

A display module according to an aspect of the present disclosure comprises a first portion including a first hole fixing the flexible printed circuit board to any one of a display panel and an inspection jig; a second portion a connector for receiving electrical signals and a indent; and a third portion connect the first portion to the second portion. Accordingly, it is possible to enhance the fixing force of the flexible printed circuit board, and to prevent it from being torn.

According to another aspect of the present disclosure, the second and third portions may have any one shape of 'ㄴ', 'ㄷ', and 'ㄹ'.

According to another aspect of the present disclosure, the second and third portions having the 'ㄷ' shape may include indents symmetrical to each other.

According to another aspect of the present disclosure, the first portion may include an auxiliary hole.

According to another aspect of the present disclosure, the corners included in the first and third portion may have at least one second hole, and at least one support film may be disposed at a periphery of the at least one of the first hole and the second hole.

According to another aspect of the present disclosure, the second hole may be on a corner of the flexible printed circuit board and the corner may be chamfered.

According to another aspect of the present disclosure, the corners of the flexible printed circuit board may be not right angles.

According to another aspect of the present disclosure, at least one corner indent may be formed at a portion in which two edges of the flexible printed circuit board meet to each other.

It will be apparent to those skilled in the art that various modifications and variations may be made in the present disclosure without departing from the spirit or scope of the disclosure. Thus, it is intended that embodiments of the present disclosure cover the modifications and variations of this disclosure provided they come within the scope of the appended claims and their equivalents.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display module comprising:
   a display panel including a display area and a non-display area;
   a flexible film attached to the display panel to which a driving unit is mounted; and
   a flexible printed circuit board attached to the flexible film and having a connector for receiving external signals, wherein the flexible printed circuit board includes:
      at least one hole configured to fix the flexible printed circuit board to a rear surface of the display panel by bending the flexible film; and
      at least one indent configured to fix the flexible printed circuit board to an inspection jig.

2. The display module of claim 1, wherein the flexible printed circuit board further includes at least one support film surrounding the at least one hole.

3. The display module of claim 2, wherein the at least one hole is disposed at a corner of the flexible printed circuit board, and the corner in which the at least one hole is disposed is chamfered.

4. The display module of claim 1, wherein a plurality of corners of the flexible printed circuit board are not right angles.

5. The display module of claim 1, wherein the at least one indent is disposed on an edge constituting a shape of the flexible printed circuit board.

6. The display module of claim 1, wherein the at least one indent is disposed on an edge surrounding and adjacent to the connector.

7. The display module of claim 1, wherein the flexible printed circuit board further includes at least one corner indent formed at a portion in which two edges of the flexible printed circuit board meet to each other.

8. The display module of claim 1, wherein the flexible printed circuit board further includes an auxiliary hole exposing the driving unit.

9. The display module of claim 1, wherein the at least one hole is configured to fix the flexible printed circuit board to the inspection jig during inspection of the display module, and the at least one hole is configured to fix the flexible printed circuit board to the rear surface of the display panel after the inspection.

10. A flexible printed circuit board comprising:
    a first portion including a first hole configured to fix the flexible printed circuit board to any one of a display panel or an inspection jig;
    a second portion including a connector for receiving electrical signals and an indent configured to fix the flexible printed circuit board to the inspection jig; and
    a third portion connect the first portion to the second portion.

11. The flexible printed circuit board of claim 10, wherein the second portion and the third portion have a shape of 'ㄴ', 'ㄷ', or 'ㄹ'.

12. The flexible printed circuit board of claim 11, wherein the second portion and the third portion having the 'ㄹ' shape includes indents symmetrical to each other.

13. The flexible printed circuit board of claim 10, wherein the first portion includes an auxiliary hole.

14. The flexible printed circuit board of claim 10, further comprising at least one second hole at corners in the second portion or the third portion and a support film at a periphery of the at least one of the first hole and the second hole.

15. The flexible printed circuit board of claim 14, wherein the second hole is on a corner of the flexible printed circuit board and the corner is chamfered.

16. The flexible printed circuit board of claim 10, wherein corners of the flexible printed circuit board are not right angles.

17. The flexible printed circuit board of claim 10, further comprising at least one corner indent formed at a portion in which two edges of the flexible printed circuit board meet each other.

* * * * *